United States Patent
Morishima

(10) Patent No.: US 9,893,685 B2
(45) Date of Patent: Feb. 13, 2018

(54) DRIVING APPARATUS

(71) Applicant: Yamaha Corporation, Hamamatsu-shi, Shizuoka (JP)

(72) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 58 days.

(21) Appl. No.: 14/687,509

(22) Filed: Apr. 15, 2015

(65) Prior Publication Data
US 2015/0303884 A1 Oct. 22, 2015

(30) Foreign Application Priority Data
Apr. 16, 2014 (JP) ................................. 2014-084586

(51) Int. Cl.
| | |
|---|---|
| H03F 99/00 | (2009.01) |
| H03F 3/185 | (2006.01) |
| H03F 3/30 | (2006.01) |
| H04R 3/08 | (2006.01) |
| H04R 1/28 | (2006.01) |

(52) U.S. Cl.
CPC .............. H03F 3/185 (2013.01); H03F 3/30 (2013.01); H04R 3/08 (2013.01); *H03F 2200/462* (2013.01); *H04R 1/2819* (2013.01)

(58) Field of Classification Search
CPC ...... H03F 3/185; H03F 3/30; H03F 2200/462; H03G 3/20; H04R 3/08; H04R 1/2819
USPC ... 381/120, 121, 96, 89, 336, 111, 117, 396, 381/332, 150; 330/260, 252; 341/144, 341/126, 155
See application file for complete search history.

(56) References Cited

U.S. PATENT DOCUMENTS

| | | | |
|---|---|---|---|
| 4,987,564 A | | 1/1991 | Yokoyama |
| 5,014,320 A | * | 5/1991 | Nagi ......................... H04R 3/04 |
| | | | 381/96 |
| 8,896,471 B1 | * | 11/2014 | Pagnanelli .................... 341/143 |

(Continued)

FOREIGN PATENT DOCUMENTS

JP 1-302997 A 12/1989

OTHER PUBLICATIONS

MJ Musen and Jikken, Apr. 1989, pp. 80-87, including partial English translation (eight (8) pages).

*Primary Examiner* — Vivian Chin
*Assistant Examiner* — Con P Tran
(74) *Attorney, Agent, or Firm* — Crowell & Moring LLP

(57) ABSTRACT

A driving apparatus includes a power amplifier that supplies a driving signal to a vibrator, a current detector that outputs a detection signal corresponding to a driving current of the vibrator, and a driving controller that positively feedback a signal based on the detection signal to the power amplifier. The driving controller includes an A/D converter that A/D converts the detection signal, a first processing section that applies a gain compensation and compressor processes to an output digital signal of the A/D converter, a second processing section that performs a process of adding a digital signal corresponding to an input signal of the driving apparatus to an output digital signal of the first processing section, and a D/A converter that D/A converts an output digital signal of the second processing section to produce an analog signal supplied to the power amplifier.

3 Claims, 13 Drawing Sheets

(56) References Cited

U.S. PATENT DOCUMENTS

2005/0031097 A1\* 2/2005 Rabenko ............... H04B 3/23
379/93.31

\* cited by examiner

FIG.6

| KIND OF FILTER | THE NUMBER OF TAPS | RIPPLE IN PASS BAND | CUT-OFF CHARACTERISTICS | PHASE | DELAY TIME |
|---|---|---|---|---|---|
| LINEAR SHAPE | MANY | SMALL | STEEP | FLAT | LARGE |
| | FEW | LARGE | GENTLE | FLAT | LARGE |
| MINIMUM PHASE | MANY | SMALL | STEEP | ROTATE | SMALL |
| | FEW | LARGE | GENTLE | ROTATE | SMALL |

DRIVING APPARATUS

BACKGROUND OF THE INVENTION

1. Field of the Invention

The present invention relates to a driving apparatus for driving a speaker.

2. Description of the Related Art

Conventionally, various techniques for generating a bass tone from a small speaker have been proposed. FIG. 13 shows an example of a speaker driving circuit in which the technique of the Helmholtz resonance is combined with that of negative driving. According to the circuit, even when a small speaker is used, a bass tone can be efficiently generated. Referring to the figure, an inverting amplifier circuit 300 has a differential amplifier 20 of gain A. A speaker 1 and a resistor Rc are connected in series between the output end of the differential amplifier 20 and the ground. The junction between the speaker 1 and the resistor Rc is connected to an adder 26 through a feedback amplifier 25. The transmission gain of the feedback amplifier 25 is set to β which is a fixed value. The input signal Si is processed by a characteristic compensating equalizer 27, added to the output of the feedback amplifier 25 in the adder 26, and then supplied to the differential amplifier 20. An acoustic apparatus like this is disclosed in, for example, JP-A-1-302997.

In the circuit shown in FIG. 13, the output impedance Zo from the inverting amplifier circuit 300 is indicated by the following formula.

$$Zo = Rc \cdot (1 - A\beta) \quad (1)$$

Therefore, it is seen that the output impedance Zo is a negative resistance.

When the electric resistance of the voice coil of the speaker 1 is defined as RL, the electric resistance RL functions as the damping resistance common to a speaker unit 4 and a motional impedance of a cabinet 6 using the Helmholtz resonance. Values of the each resistances are set so that the output impedance Zo in the formula (1) has a value which cancels the electric resistance RL of the voice coil of the speaker 1, i.e., −RL. Therefore, the speaker unit 4 and the cabinet 6 are separately constant-voltage driven so that a bass tone can be efficiently generated.

In the acoustic apparatus of JP-A-1-302997, however, the characteristics of the speaker 1 are largely varied or dispersed, and there is a possibility that oscillation may occur. Moreover, a non-linear operation is so hard that the control signal which is output of the feedback amplifier 25 can be distorted. When a complex control is to be performed, furthermore, the circuit is complicated, and the production cost is increasing.

SUMMARY OF THE INVENTION

The invention is made in view of the above-described situation. It is an object of the present invention to realize a driving apparatus in which, even when the characteristics of a speaker are varied or dispersed, it is possible to prevent oscillation, distortion can be compressed by continuously changing a control signal, and the production cost can be reduced.

In order to solve the above-discussed problem, the driving apparatus of the invention is a driving apparatus for driving a vibrator, comprising:

a power amplifier configured to supply a driving signal to the vibrator;

a current detector configured to output a detection signal corresponding to a driving current flowing through the vibrator; and a driving controller configured by a digital circuit and configured to positively feedback a signal based on the detection signal to an input side of the power amplifier to equivalently generate a negative impedance in an output impedance of the power amplifier, thereby controlling a driving state so that an internal impedance inherent to the vibrator is equivalently reduced or disabled, wherein the driving controller includes:

an A/D converter configured to A/D convert the detection signal;

a first processing section configured to apply a gain compensation process and a compressor process to an output digital signal output from the A/D converter;

a second processing section configured to perform an adding process of adding a digital signal corresponding to an input signal input into the driving apparatus, to an output digital signal output from the first processing section; and a D/A converter configured to D/A convert an output digital signal output from the second processing section to produce an analog signal, and to supply the analog signal to the power amplifier.

According to the invention, the detection signal corresponding to the driving current of the vibrator is detected as an output signal of the current detector, and input to the driving controller. The driving controller positively feeds back a signal based on the detection signal to the input side of the power amplifier to cause a negative impedance to be equivalently generated in the output impedance of the power amplifier, whereby the driving state can be controlled so that the internal impedance inherent to the vibrator is equivalently reduced or disabled.

When the driving controller is configured by an analog circuit, the configurations of the gain and the phase compensating circuits are complicated, and the feedback system is unstable because of dispersion of the analog circuit. The driving controller in the present invention is configured by the digital circuit, and the processing section included in the driving controller applies gain compensation on the digital signal based on the output signal of the current detector. Therefore, the gain compensation process of equivalently reducing or disabling the internal impedance inherent to the vibrator can be easily performed by the digital circuit.

In the case where the amplitude is large, when the compressor process involving a nonlinear operation for preventing distortion of the speaker unit and sounding (chattering and wind noise) of the cabinet is to be realized by an analog circuit, the nonlinear characteristics of diodes and transistors are used. Because of dispersion of device elements or the like, however, it is not easy to obtain highly accurate characteristics. Therefore the characteristics must be adjusted, and the configuration becomes complicated. According to the invention, by contrast, the compressor process is realized by the digital circuit, and therefore highly accurate nonlinear characteristics can be obtained by the simple configuration.

BRIEF DESCRIPTION OF THE DRAWINGS

FIG. 6 is a view showing differences between characteristics of a linear-phase FIR filter and a minimum-phase FIR filter.

DETAILED DESCRIPTION OF THE EXEMPLARY EMBODIMENTS

First Embodiment

Figure 1:
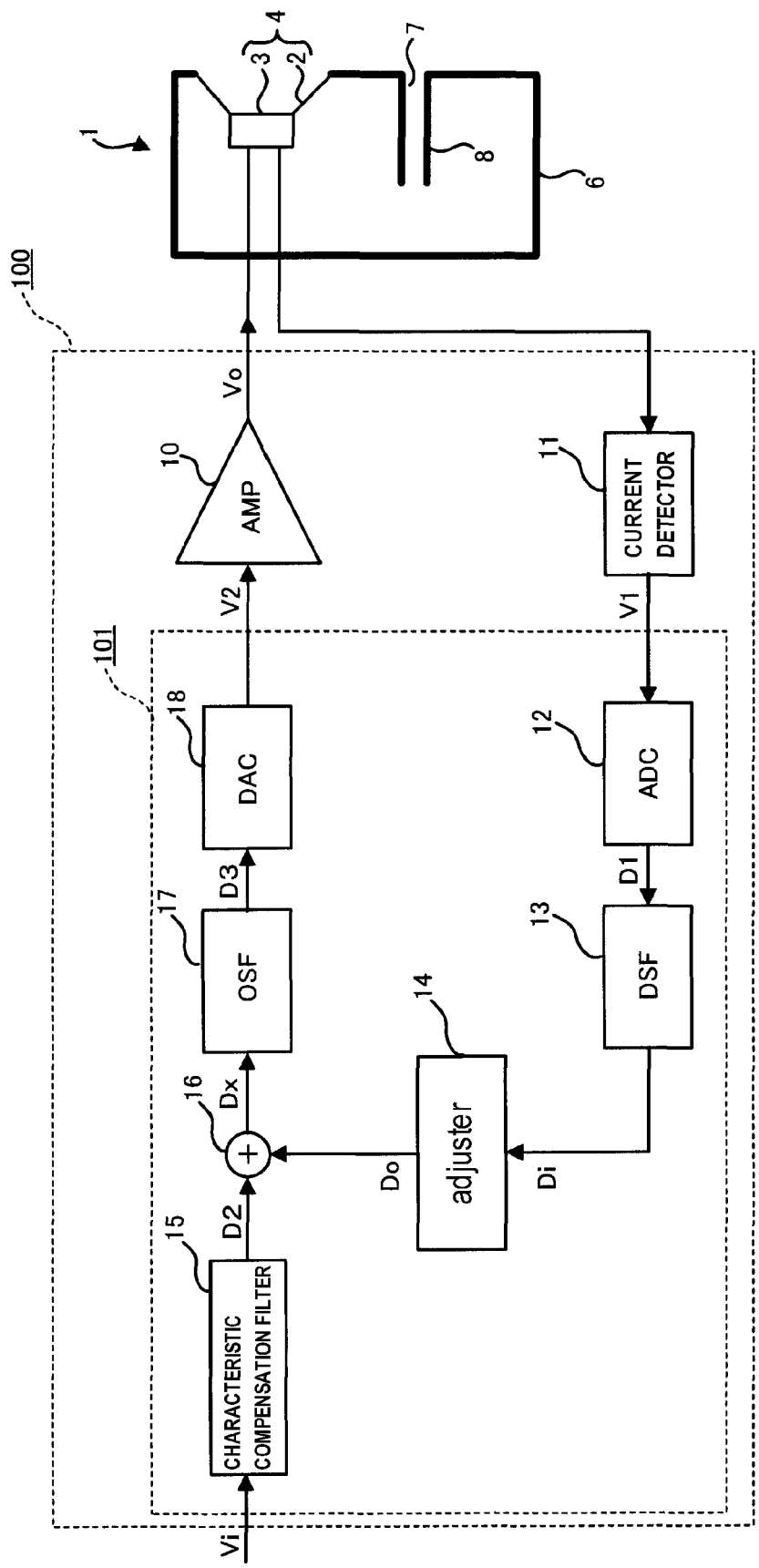
FIG. 1 is a block diagram showing a driving apparatus for a speaker which is a first embodiment of the invention.

Hereinafter, embodiments of the present invention will be described with reference to the drawings. FIG. 1 is a block diagram showing a driving apparatus 100 for a speaker 1 which is a first embodiment. The driving apparatus 100 includes an amplifier 10, a current detector 11, and a driving controller 101. The driving controller 101 includes an ADC section 12, a DSF section 13, an adjuster 14, a characteristic compensation filter 15, an adder 16, an OSF section 17, and a DAC section 18.

The speaker 1 is a bass-reflex type speaker. In the speaker, a hole is opened in the front surface of a cabinet 6, a speaker unit (vibrator) 4 configured by a diaphragm 2 and a converter 3 is attached to the hole, a tube port 8 functioning as a resonance opening having a bass reflex port 7 is disposed below the unit, and a Helmholtz resonator is formed by the cabinet 6 including the tube port 8. The converter 3 includes a voice coil, and has a function of converting electrical energy to mechanical energy to vibrate the diaphragm 2.

In the driving apparatus 100, a driving signal Vo output from the amplifier 10 having a gain A is given to the speaker 1. The current detector 11 detects a driving current IR flowing through the voice coil of the converter 3 in the speaker 1, and outputs a detection signal V1 indicating the level of the driving current IR. The driving current IR is positively fed back to the amplifier 10 through the adjuster 14 having a transmission gain β.

Figure 2:
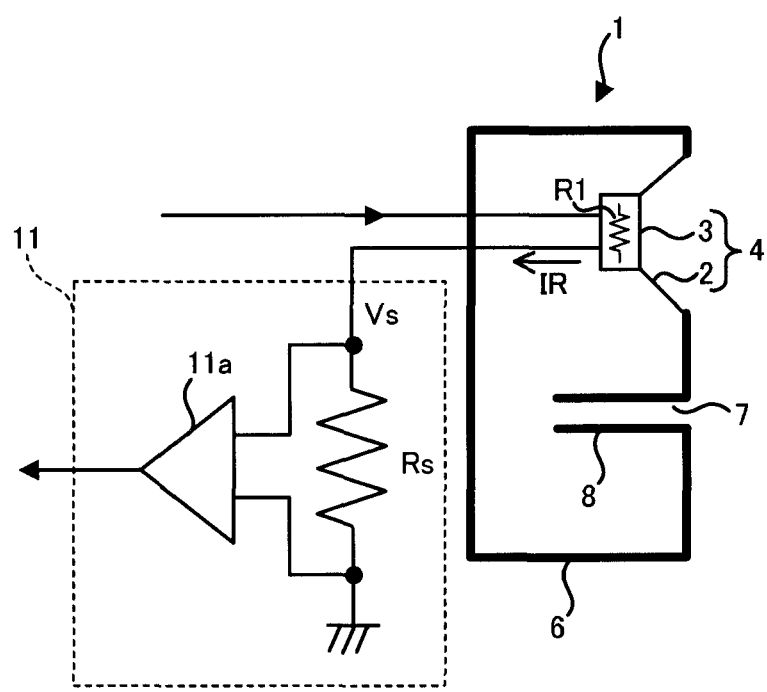
FIG. 2 is a circuit diagram showing an example of a current detector.

As shown in FIG. 2, for example, the current detector 11 is a circuit which outputs the driving current IR flowing through the resistance R1 of the voice coil of the converter 3, as the detection signal V1 that is a signal obtained by amplifying the voltage Vs across a resistor Rs by an amplifier 11a.

In the above circuit, the output impedance Zo of the amplifier 10 is obtained by following formula:

$$Zo = Rs(1-A\beta) \quad (2)$$

In the formula (2), when $A\beta > 1$, Zo is an open-circuit stable negative impedance.

Figure 4:
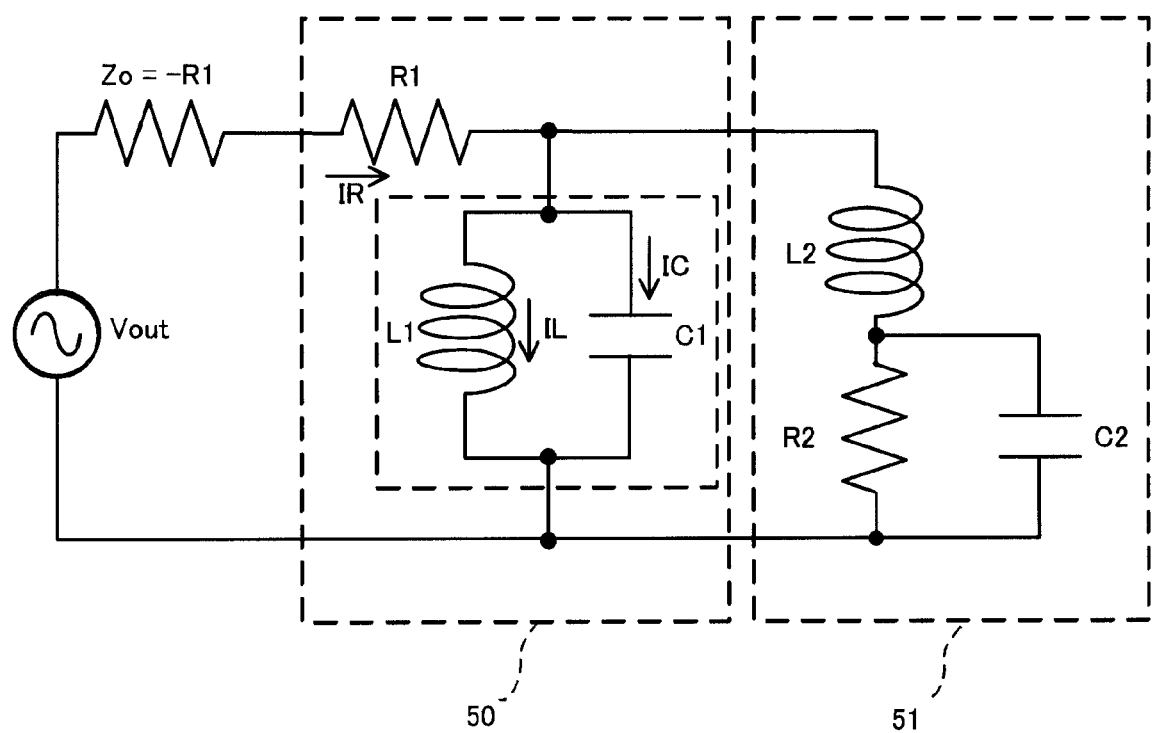
FIG. 4 is a circuit diagram showing an electrical equivalent circuit of a speaker unit and the driving apparatus.

FIG. 4 shows electrical equivalent circuits of the bass-reflex type speaker 1 and the driving apparatus 100 including a negative impedance shown in FIG. 1. The speaker unit equivalent circuit 50 is configured by the resistance R1 of the voice coil of the converter 3, and a parallel resonance circuit due to the equivalent motional impedance of the speaker unit 4. The cabinet equivalent circuit 51 is a parallel resonance circuit due to the equivalent motional impedance of a Helmholtz resonator configured by the cabinet 6 including the tube port 8.

The Q value of the speaker unit equivalent circuit 50 is a ratio of an oscillating current IL flowing through an inductor L1 in resonance to the driving current IR flowing through the resistance R1, and therefore can be indicated by following formula (3):

$$Q = IL/IR \quad (3)$$

When the angular frequency in resonance is defined as ω, the oscillating current IL flowing through the inductor L1 can be indicated by following formula (4):

$$IL = Vout/\omega L1 \quad (4)$$

The driving current IR flowing through the resistance R1 can be indicated by following formula (5):

$$IR = Vout/R1 \quad (5)$$

Substituting formula (4) and (5) into formula (6), the Q value is obtained as follows:

$$Q = (Vout/\omega L1)/(Vout/R1) = R1/\omega L1 \quad (6)$$

The angular frequency co in resonance is indicated as follows:

$$\omega = 1/(L1 \cdot C1)^{1/2} \quad (7)$$

When formula (7) is substituted into formula (6), the Q value of the speaker is obtained as follows:

$$Q = R1/\omega L1 = R1 \cdot (C1/L1)^{1/2} \quad (8)$$

Figure 5:
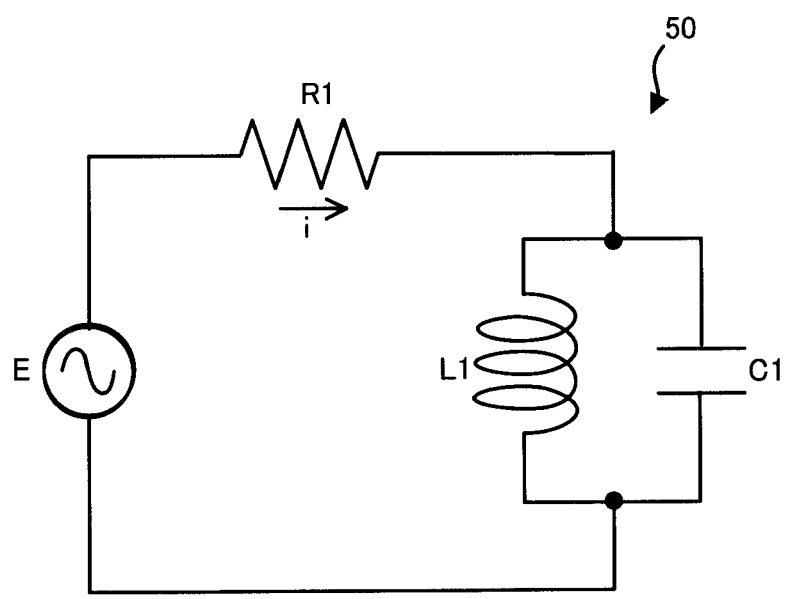
FIG. 5 is a circuit diagram showing an equivalent circuit of the speaker unit.

Here, only the speaker unit equivalent circuit 50 is extracted into FIG. 5, and it is assumed that the driving voltage is E, the equivalent mass of the vibration system is M, the stiffness of the vibration system is S, the magnetic flux density of the converter 3 is B, the effective length of the voice coil of the converter 3 is λ, and a current i flows through the voice coil. A force F which is proportional to the current i acts on the voice coil which is placed in the magnetic flux density B, and which has the effective length λ. The force F is given by formula (9):

$$F = B\lambda i \quad (9)$$

The force functions as a driving force for the vibration system. In this case, the mechanical impedance Zm which is a ratio of the driving force and the velocity can be expressed by following formula (10):

$$Zm = j(\omega M - S/\omega) \quad (10)$$

The impedance Ze of the voice coil in resonance is given formula (11):

$$Ze = R1 \quad (11)$$

When the vibration system is moved at the velocity v, the force is Zmv. The force is equal to the force which is indicated formula (9), and which is caused by the current of the voice coil.

$$F = B\lambda i = Zmv \quad (12)$$

In the driving voltage E, first, a voltage drop Ze·i is occurred by the electrical impedance of the voice coil itself. When a force is applied to the vibration system by the current, a counter electromotive force is generated in the voice coil. Therefore, the driving voltage E is equal to the sum of the voltage drop Ze·i and the counter electromotive force. The counter electromotive force is obtained by multiplying the magnetic flux density B and the effective length λ with the velocity v.

$$E=Ze\cdot i+B\lambda v \quad (13)$$

From formula (12), the velocity v is Bλi/Zm. Substituting the velocity into formula (13), formula (14) is obtained.

$$E=Ze\cdot i+(B\lambda)^2 i/Zm \quad (14)$$

Therefore, the impedance Z of the speaker unit equivalent circuit 50 shown in FIG. 4 can be expressed by following formula (15):

$$Z=E/i=Ze+(B\lambda)^2/Zm \quad (15)$$

Formula (10) and (11) are substituted into formula (15), and then the following is obtained.

$$Z=R1+(B\lambda)^2/i(\omega M-S/\omega) \quad (16)$$

When formula (16) is modified, formula (17) is obtained:

$$Z=R1+j[1/((S/\omega(B\lambda)^2)-(\omega M/(B\lambda)^2))] \quad (17)$$

When the impedance of the speaker unit equivalent circuit 50 shown in FIG. 4 is expressed by an inductor L1 and a capacitor C1, formula (18) is obtained:

$$Z=R1+j[1/((1/\omega L1)-\omega C1)] \quad (18)$$

When formula (17) and (18) are compared with each other, the inductor L1 and the capacitor C1 can be expressed as follows:

$$L1=(B\lambda)^2/S \quad (19a)$$

$$C1=M/(B\lambda)^2 \quad (19b)$$

Substituting the result into formula (8), the Q value of the speaker can be expressed by following formula (20):

$$Q=R1\cdot(MS)^{1/2}/(B\lambda) \quad (20)$$

The formula (20) indicates that, when R1 is reduced, the Q value of the speaker can be reduced. In the equivalent circuit of FIG. 4, when the speaker is driven by the driving apparatus 100 having the output impedance Zo of -R1, therefore, the resistance of the voice coil is apparently zero, and the constant velocity driving in which the velocity of the driving system is proportional to the input voltage is realized. As seen from FIG. 4, the resistance R1 functions as the damping resistance common to the motional impedances of the speaker unit 4 and the cabinet 6. When the resistance R1 is cancelled by the negative impedance of the driving apparatus 100, therefore, the speaker unit and the cabinet are separately constant-voltage driven.

In the embodiment, therefore, the driving apparatus 100 is operated so that the output impedance Zo of the driving apparatus 100 given by formula (2) is -R1. For example, the driving apparatus 100 is realized by a DSP, and each of the components of the driving apparatus 100 shown in FIG. 1 is a functional block showing a function of the DSP.

For example, the ADC section 12 is a block having a function of a ΔΣ-type A/D converter, and performs high-speed A/D conversion on the voltage (detection signal V1) corresponding to the detection current which is the output of the current detector 11. For example, the output voltage of the current detector 11 is converted by the ADC section 12 to a first digital signal D1 having a frequency of 6.144 MHz.

The DSF section 13 is a block having a function of a downsampling filter which is used for lowering the sampling frequency. The first digital signal D1 which is output from the ΔΣ-type ADC section 12, and which has a frequency of 6.144 MHz is a 1-bit signal. When the signal is supplied as it is to the adjuster 14, therefore, the processing load in the adjuster 14 is increased. In the embodiment, consequently, the DSF section 13 is used for lowering the sampling frequency fs to 48 kHz which is 1/128 of the original frequency, and the resulting signal is output as a second digital signal Di. The DSF section 13 has also a function of a low-pass filter for cutting a large amount of quantization noise generated by the ΔΣ-type A/D conversion. In the embodiment, an IIR filter with low delay, or a minimum-phase FIR filter is used as the DSF section 13.

A minimum-phase FIR filter is used because, when the DSF section 13 is configured by a linear-phase FIR filter, the delay is large, and hence there is a possibility that oscillation may occur. FIG. 6 shows differences between characteristics of a linear-phase FIR filter and a minimum-phase FIR filter. As shown in FIG. 6, in a linear-phase FIR filter, the delay time is long regardless of the number of taps. In a minimum-phase FIR filter, by contrast, the delay time is short regardless of the number of taps. In the embodiment, a minimum-phase FIR filter having a small number of taps, for example, about 128 taps is used as the DSF section 13.

Figure 3:
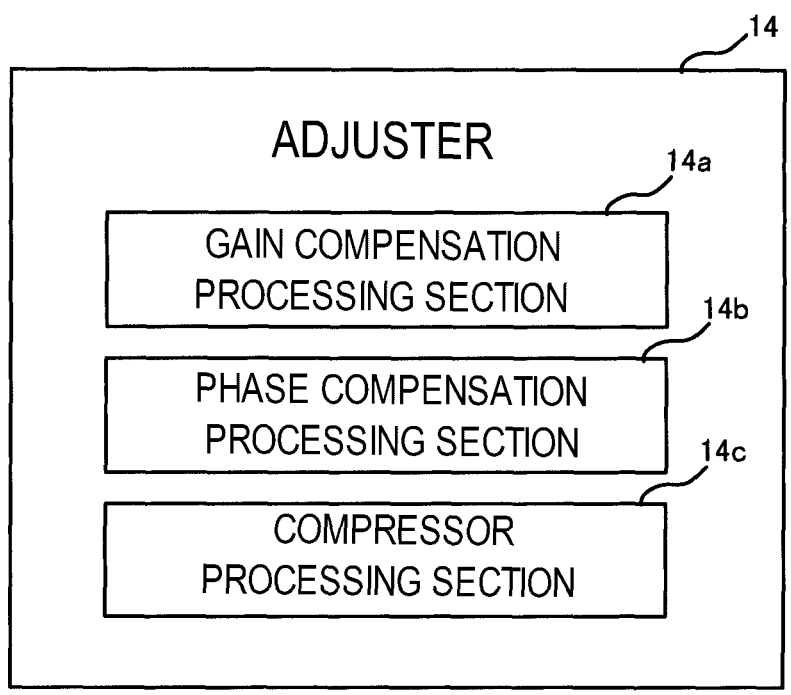
FIG. 3 is a block diagram showing the configuration of a processing section.

As shown in FIG. 3, the adjuster 14 is a functional block including a gain compensation processing section 14*a*, a phase compensation processing section 14*b*, and a compressor processing section 14*c*. The gain compensation processing section 14*a* performs the above-described process of adjusting the transmission gain β indicated in formula (2).

Figure 7:
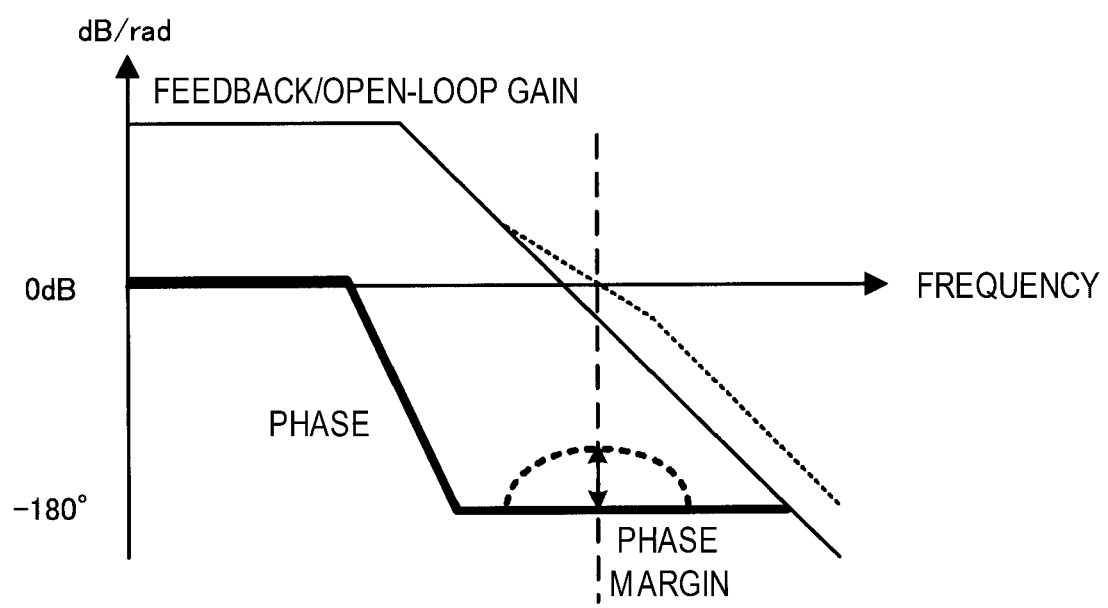
FIG. 7 is a view illustrating phase compensation in a secondary low-pass filter.

The functional block which performs a phase compensation process in the adjuster 14, i.e., the phase compensation processing section 14*b* performs a process so as to ensure a phase margin when the open loop gain of the feedback loop is 0 dB, thereby prevent the feedback loop from oscillating. FIG. 7 shows an example in which a secondary low-pass filter is used as the gain compensation processing section 14*a*. As indicated by the solid line, the phase is rotated by 180° when the open loop gain is 0 dB, and therefore the oscillation conditions are satisfied. In order to avoid these conditions, a high-pass filter, in which the phase advances when the open loop gain is 0 dB, is connected, and then the phase is returned as indicated by the broken line to ensure the phase margin. Also in the embodiment, a low-pass filter is configured in the DSF section 13, and therefore there is a 0 dB crossing in the feedback loop. Moreover, a delay due to the sampling process is inherent, and the phase margin tends to disappear. In the embodiment, therefore, a high-pass filter or high-boost filter which performs phase compensation is inserted in the functional block which performs a phase compensation process, to perform a process to ensure the phase margin to avoid the oscillation condition of the feedback loop.

In order to prevent distortion of the speaker 1, the functional block which performs a compressor process in the adjuster 14, i.e., the compressor processing section 14*c* adjusts the transmission gain β in accordance with the second digital signal Di corresponding to the driving current IR. When the feedback amount is increased, distortion or oscillation may occur because of the drive limit or heating of the voice coil of the converter 3 in the speaker 1, the drive limit of the diaphragm 2, or the like. Therefore, a reference value is previously set with respect to the value of a third digital signal Do which is output from the adjuster 14 and the transmission gain β is adjusted in the compressor processing section 14*c*, so that the value of the third digital signal Do does not exceed the reference value.

In the embodiment, the DSF section 13 and the adjuster 14 function as the first processing section which applies at least the gain compensation and compressor processes to the output digital signal of the ADC section 12.

The characteristic compensation filter 15 is a functional block having a function of a filter for preventing from rising of the sound pressure at a frequency of the middle range or higher. In a bass-reflex type speaker, the front sound pressure and the sound pressure of the cabinet 6 are added in phase to each other. The sound pressure of the cabinet 6 exhibits single peak characteristics of, for example, +6 dB/oct at a frequency which is not higher than the resonance frequency, and −6 dB/oct at a frequency which is not lower than the resonance frequency. When the sound pressure of the speaker 1 is lowered at −6 dB/oct in the low range, therefore, the sound pressure is synthesized to be flat. At a frequency of the middle range or higher, however, the sound pressure is raised. In the embodiment, therefore, the characteristic compensation filter 15 performs a process so as to output the resulting signal as a sixth digital signal D2. In the process, at a frequency which is not lower than the middle range, an input signal Vi is provided with the integral characteristics, and, at a frequency in the low range, the input signal is provided with the differential characteristics in order to compress the amplitude. For example, an FIR filter may be used as the characteristic compensation filter 15. When an FIR filter is used, the correction including also the phase correction may be performed.

The adder 16 adds the sixth digital signal D2 output from the characteristic compensation filter 15, to the third digital signal Do output from the adjuster 14, and outputs a fourth digital signal Dx with a sampling frequency of 48 kHz.

For example, the OSF section 17 is a block having a function of a 128-fold oversampling filter which converts the fourth digital signal Dx that is output from the adder 16, and that has a sampling frequency of 48 kHz, to a fifth digital signal D3 having a frequency of 6.144 MHz. The OSF section 17 may be configured by, for example, an upsampling filter and a low-pass filter. For example, in a case where an FIR filter is used, a minimum-phase FIR filter is used in the OSF section 17.

In the embodiment, the adder 16 and the OSF section 17 function as the second processing section which performs a process of adding at least the digital signal corresponding to the input signal of the driving apparatus 100, to the output digital signal of the first processing section.

For example, the DAC section 18 is a block having a function of a $\Delta\Sigma$-type D/A converter, and performs high-speed D/A conversion on the fifth digital signal D3 in which the frequency is raised to 6.144 MHz by the OSF section 17, and outputs a voltage V2. In the DAC section 18, for example, an error feedback circuit may be configured by a quantizer, a loop filter, and an adder. A loop filter is a digital filter which processes a truncation error, and may be configured by pluralities of delay elements, multipliers, and adders.

When a constant inherent to the speaker unit is incorporated in the thus configured driving apparatus 100, the impedance of the speaker unit can be adequately cancelled to prevent distortion of the speaker unit and sounding (chattering and wind noise) of the cabinet, and the optimum characteristic compensation can be performed.

When a driving apparatus which cancels the impedance of the speaker unit is configured by an analog circuit, the configurations of the gain and phase compensating circuits are complicated, and the feedback system is unstable because of dispersion of the analog circuit. In the embodiment, by contrast, the driving apparatus is configured by a digital circuit such as a DSP, and therefore a stable phase compensation process in which the feedback loop does not oscillate can be easily performed.

In the case where the amplitude is large, when the compressor process involving a nonlinear operation for preventing distortion of the speaker unit is to be realized by an analog circuit, the nonlinear characteristics of diodes and transistors are used. Because of dispersion of device elements or the like, however, it is not easy to obtain highly accurate characteristics. The characteristics must be adjusted, and therefore the configuration is complicated. In the embodiment, by contrast, the compressor process is realized by a digital circuit, and therefore highly accurate nonlinear characteristics can be obtained by the simple configuration. When an FIR filter is used as the characteristic compensation filter, moreover, the correction including also the phase correction can be performed.

Second Embodiment

Figure 9:
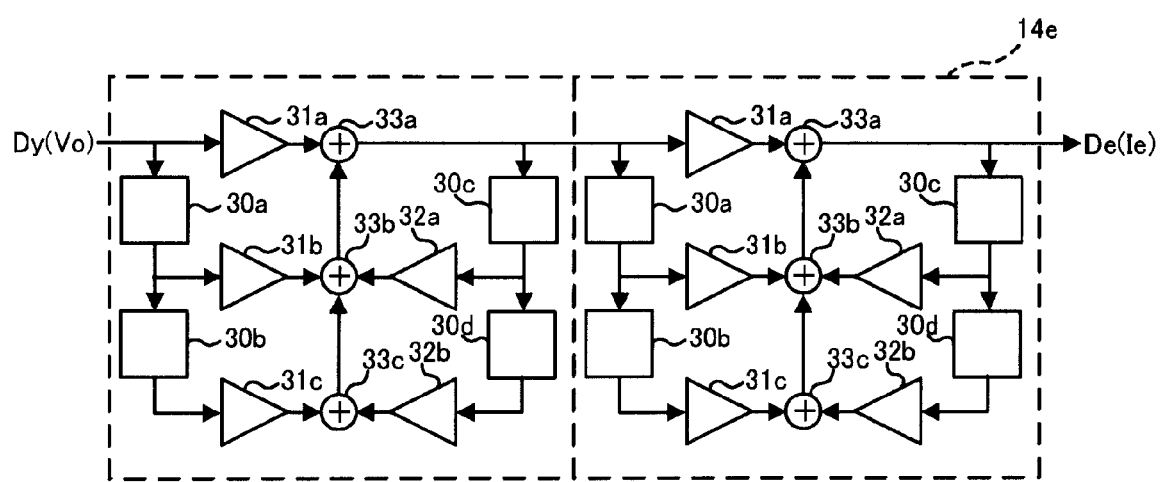
FIG. 9 is a block diagram showing the configuration of an equivalent model.
Figure 10:
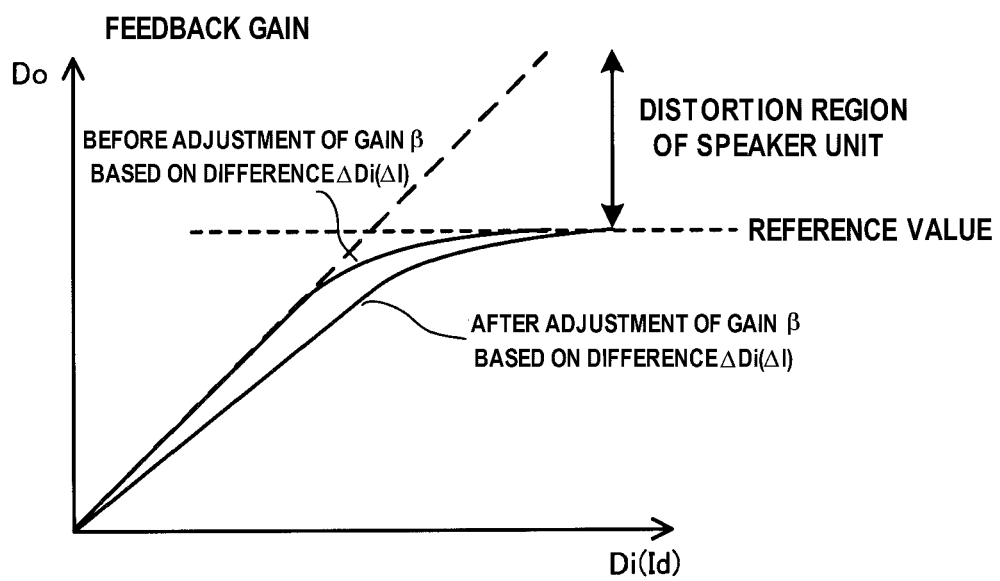
FIG. 10 is a view illustrating a compressor process based on the equivalent model.

Next, a second embodiment of the invention will be described with reference to FIGS. 8 to 10. The embodiment is different from the first embodiment in that an equivalent model of a speaker including a cabinet is prepared, and an estimation current in the equivalent model is compared with the detection current detected by the current detector, thereby performing the compressor process.

Figure 8:
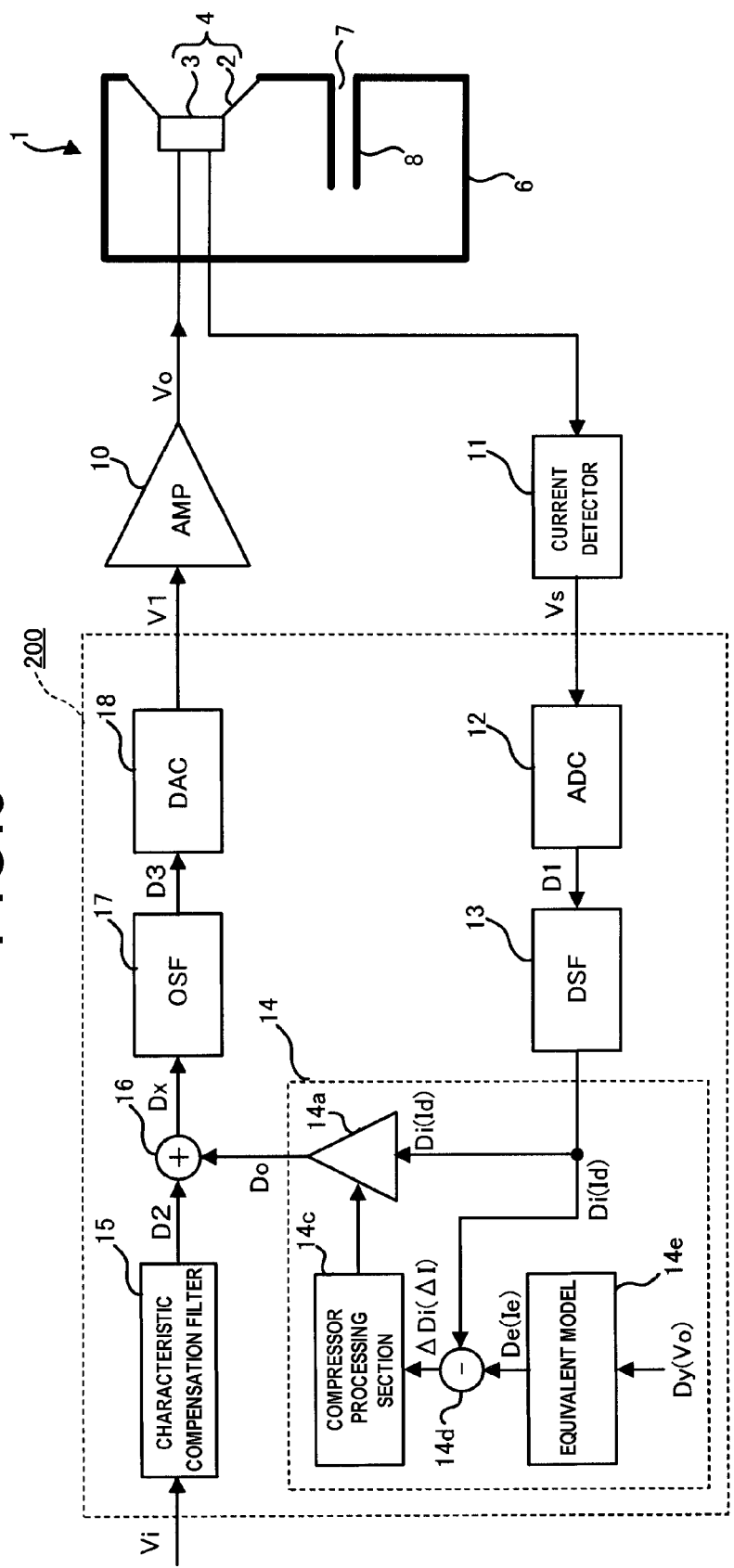
FIG. 8 is a block diagram showing a driving apparatus for a speaker which is a second embodiment of the invention.

FIG. 8 is a block diagram showing a driving apparatus 200 for the speaker 1 which is the second embodiment. In the driving apparatus 200 of the embodiment, as shown in FIG. 8, the configuration of the adjuster 14 is different from that in the first embodiment. The adjuster 14 in the embodiment is configured by the gain compensation processing section 14a, the compressor processing section 14c, a subtractor 14d, and an equivalent model 14e. Similarly to the first embodiment, the gain compensation processing section 14a performs the above-described process of adjusting the transmission gain $\beta$ shown in formula (2). Specifically, the section determines the third digital signal Do in accordance with the second digital signal Di(Id) corresponding to a current Id detected by the current detector 11.

The equivalent model 14e is the electrical equivalent circuit of the speaker 1 including the cabinet 6 by a digital signal process. In the embodiment, the equivalent circuit of the resonance of the cabinet 6 and the speaker unit 4 can be configured by two stage of secondary IIR filters. FIG. 9 shows the equivalent model 14e configured by secondary IIR filters. The equivalent model 14e includes delay devices 30a to 30d, multipliers 31a to 31c, multipliers 32a, 32b, and adders 33a to 33c. A digital voltage Dy(Vo) corresponding to the driving signal Vo output from the amplifier 10 which functions as a power amplifier is input to the equivalent model 14e. Defining the electric resistance of the voice coil of the speaker unit 4 as R1, a digital voltage De(Ie) corresponding to an estimation current Ie which is estimated to be detected by the current detector 11 is output.

In the embodiment, the digital voltage De(Ie) corresponding to the estimation current Ie, and the digital voltage Di(Id) corresponding to the detection current Id which is actually detected by the current detector 11 are supplied to the subtractor 14d. Therefore, the subtractor 14d outputs the difference $\Delta Di(\Delta I)$ between the digital voltage De(Ie) corresponding to the estimation current Ie and the digital voltage Di(Id) corresponding to the detection current Id, and the difference is supplied to the compressor processing section 14c.

If the input difference $\Delta Di(\Delta I)$ is a positive value, the compressor processing section 14c determines that the electrical resistance R1 of the voice coil of the speaker unit 4 is lowered, and adjusts the transmission gain β of the gain compensation processing section 14a so as to be lowered. As a result, the feedback loop is stabilized. Similarly to the first embodiment, as shown in FIG. 10, the compressor processing section 14c previously sets a reference value with respect to the value of the third digital signal Do output from the adjuster 14, and adjusts the transmission gain β so that the value of the third digital signal Do does not exceed the reference value. If the difference ΔDi(ΔI) is a positive value, the compressor processing section 14c adjusts the transmission gain β based on the difference ΔDi(ΔI). Even if the resistance R1 of the voice coil of the speaker unit 4 is lowered, therefore, it is possible to prevent distortion of the speaker 1.

In the case where the voltage De(Ie) corresponding to the estimation current is to be compared with the voltage Di(Id) corresponding to the detection current, a band-limiting filter may be used in order to reduce noises or limit the characteristics to those which are well matched to the equivalent model.

The above-described driving apparatus 200 is comprised of, for example, a DSP and programs installed on the DSP. When an constant inherent to the speaker unit is incorporated in the driving apparatus 200 and adequate programs according to the characteristics of the speaker unit and the cabinet are used, the impedance of the speaker unit can be adequately cancelled to prevent distortion of the speaker unit and sounding (chattering and wind noise) of the cabinet, and the optimum characteristic compensation can be performed.

In the embodiment, as described above, the driving apparatus which cancels the impedance of the speaker unit is configured by digital circuits such as a DSP, and the estimation current obtained from the equivalent model of the speaker including the cabinet is compared with the detection current which is actually detected, thereby adjusting the transmission gain β. Even when the electrical resistance of the speaker unit is varied, therefore, a nonlinear operation for preventing distortion of the speaker unit can be easily performed. Also in the embodiment, similarly to the first embodiment, a phase compensation processing section may be disposed in the adjuster 14.

<Modifications>

The invention is not limited to the above-described embodiments, and following various modifications may be made. The modifications and the above-described embodiments may be adequately combined with each other.

Figure 11:
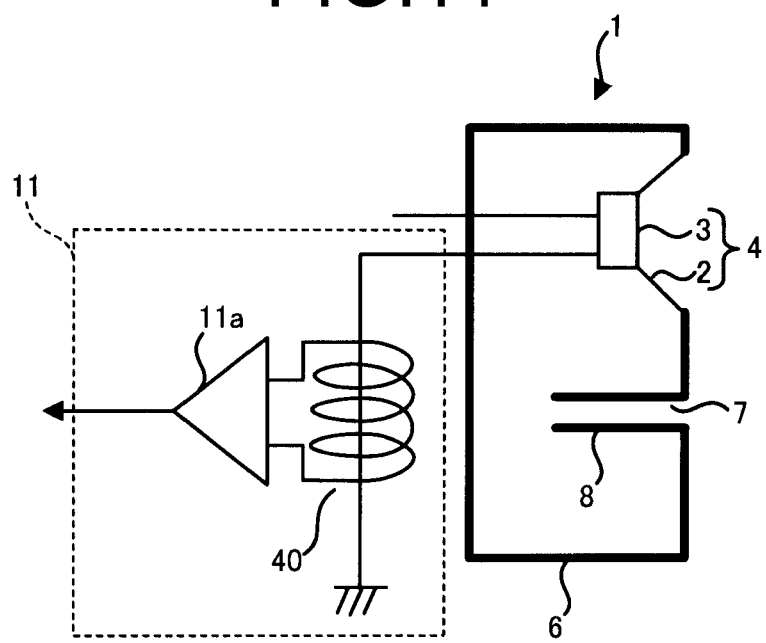
FIG. 11 is a circuit diagram showing a current detector in a modification.
Figure 12:
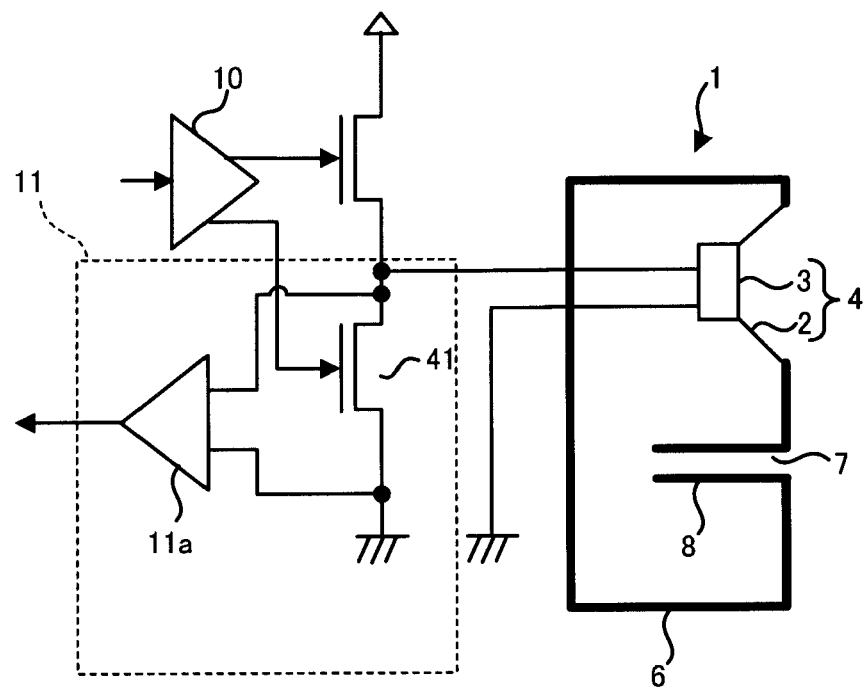
FIG. 12 is a circuit diagram showing a current detector in another modification.
Figure 13:
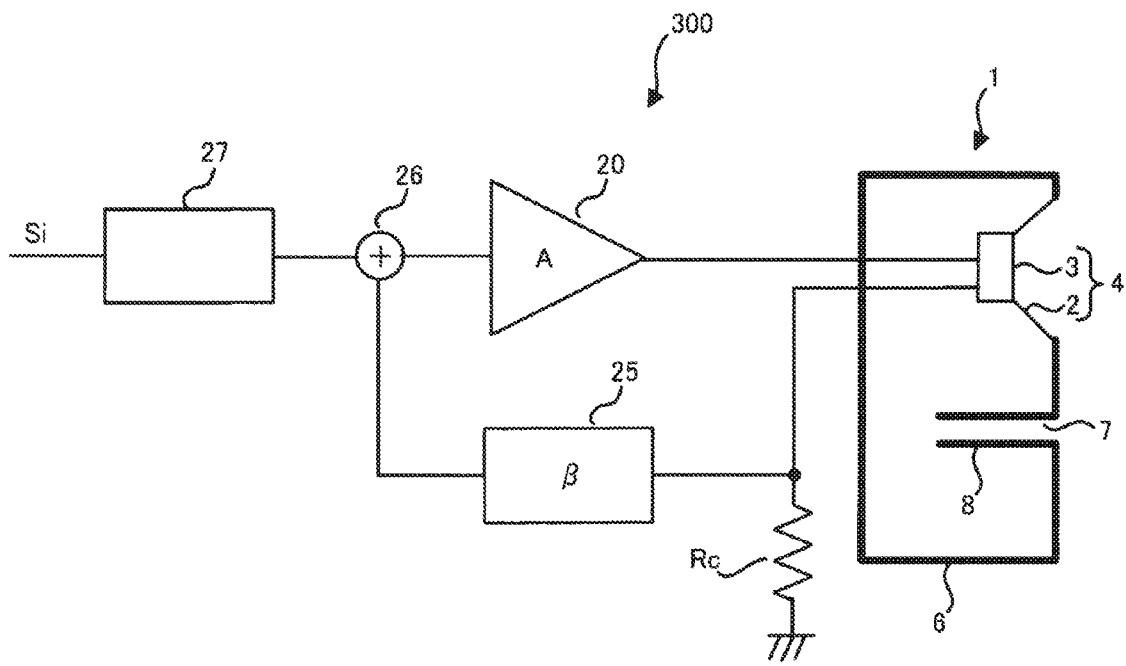
FIG. 13 is a block diagram showing a conventional driving apparatus for a speaker.

Although, in the above, the embodiments in which a detecting resistor is used as the current detector 11 have been described, the invention is not limited to the embodiments. For example, a magnetic field detecting coil 40 may be used as shown in FIG. 11, or a magnetic sensor such as a GMR or a Hall element may be used. As shown in FIG. 12, alternatively, the ON resistance of an output transistor 41 of the amplifier 10 may be used.

In the above, the embodiments in which the first processing section is configured by the DSF section 13 and the adjuster 14, and the second processing section is configured by the adder 16 and the OSF section 17 have been described. In the case where an A/D converter other than the ΔΣ-type is used as the ADC section 12, and a D/A converter other than the ΔΣ-type is used as the DAC section 18, alternatively, the first processing section may be configured by only the adjuster 14, and the second processing section may be configured by only the adder 16. The driving apparatus of the present disclosure can also be applied to a passive radiator type speaker such as a drone cone, in addition to the bass-reflex type speaker.

Here, the above embodiments are summarized as follows.

(1) There is provided a driving apparatus for driving a vibrator, comprising:

a power amplifier configured to supply a driving signal to the vibrator;

a current detector configured to output a detection signal corresponding to a driving current flowing through the vibrator; and a driving controller configured by a digital circuit and configured to positively feedback a signal based on the detection signal to an input side of the power amplifier to equivalently generate a negative impedance in an output impedance of the power amplifier, thereby controlling a driving state so that an internal impedance inherent to the vibrator is equivalently reduced or disabled, wherein the driving controller includes:

an A/D converter configured to A/D convert the detection signal;

a first processing section configured to apply a gain compensation process and a compressor process to an output digital signal output from the A/D converter;

a second processing section configured to perform an adding process of adding a digital signal corresponding to an input signal input into the driving apparatus, to an output digital signal output from the first processing section; and a D/A converter configured to D/A convert an output digital signal output from the second processing section to produce an analog signal, and to supply the analog signal to the power amplifier.

(2) In the driving apparatus according to the item (1), the vibrator is disposed in a cabinet having a resonance opening, to directly emit sound, and drives a Helmholtz resonator that is configured by the resonance opening and the cabinet, to emit a resonance sound from the resonance opening.

(3) In the driving apparatus according to the item (1) the first processing section includes: a gain compensation processing section configured to equivalently generate the negative impedance in the output impedance of the power amplifier, thereby compensating a transmission gain so that the internal impedance inherent to the vibrator is equivalently reduced or disabled; a phase compensation processing section configured to compensate a phase of the driving signal so as to prevent oscillation of the vibrator; and a compressor processing section configured to adjust the transmission gain so as to reduce distortion of an output of the vibrator.

(4) In the driving apparatus according to the item (3), the compressor processing section adjusts the transmission gain so that the output digital signal output from the first processing section does not exceed a reference value.

(5) In the driving apparatus according to the item (1), the first processing section includes: a gain compensation processing section configured to equivalently generate the negative impedance in the output impedance of the power amplifier, thereby compensating a transmission gain so that the internal impedance inherent to the vibrator is equivalently reduced or disabled; an equivalent model in which an electrical equivalent circuit of the vibrator including the cabinet is generated by a digital signal process; and a compressor processing section configured to adjust the transmission gain based on a difference between an output digital signal output from the equivalent model, and the output digital signal output from the A/D converter or a signal corresponding to the output digital signal output from the A/D converter.

(6) In the driving apparatus according to the item (1), the first processing section includes a downsampling section configured to downsample the output digital signal output from the A/D converter, the second processing section includes an oversampling section configured to oversample a signal that is produced by the adding process, and a minimum-phase FIR filter is used in the downsampling section and the oversampling section.

According to the above configurations, the gain compensation process in which the internal impedance inherent to the vibrator is equivalently reduced or disabled by the gain compensation processing section can be easily performed by the digital circuit. In the phase compensation processing section, the phase compensation process in which the feedback loop does not oscillate, can be easily performed in the digital circuit. In the case where the amplitude is large, the compressor process which is a nonlinear operation for preventing distortion of the speaker unit and sounding (chattering and wind noise) of the cabinet can be easily performed in the digital circuit.

According to the above configurations, even if the internal impedance inherent to the vibrator is changed, the change of the internal impedance is detected by obtaining the difference signal between the output digital signal of the equivalent model, and the output digital signal of the A/D converter or a signal corresponding to the output digital signal of the A/D converter. The equivalent circuit of the vibrator including the cabinet is realized in the equivalent model by a digital signal process. Therefore the transmission gain is adjusted based on the change of the internal impedance so as to prevent surely distortion of the speaker unit and sounding (chattering and wind noise) of the cabinet.

According to the above configurations, as compared to the case where a linear-phase filter is used in an upsampling section and a downsampling section, the delay time can be shortened. Therefore, the phase margin can be expanded, and the driving apparatus can be stably operated.

The present application is based on Japanese Patent Application No. 2014-084586 filed on Apr. 16, 2014, the contents of which are incorporated herein by reference.

What is claimed is:

1. An apparatus for driving a vibrator, comprising:
a power amplifier configured to supply a driving signal to the vibrator;
a current detector configured to output a detection signal corresponding to a driving current flowing through the vibrator; and
a driving controller configured by a digital circuit and configured to positively feedback a signal based on the detection signal to an input side of the power amplifier to equivalently generate a negative impedance in an output impedance of the power amplifier, thereby controlling a driving state so that an internal impedance inherent to the vibrator is equivalently reduced or disabled, wherein the driving controller includes:
an A/D converter configured to A/D convert the detection signal;
a first processing circuitry configured to apply a gain compensation process and a compressor process to an output digital signal output from the A/D converter;
a second processing circuitry configured to perform an adding process of adding a digital signal corresponding to an input signal input into the apparatus, to an output digital signal output from the first processing circuitry; and
a D/A converter configured to D/A convert an output digital signal output from the second processing circuitry to produce an analog signal, and to supply the analog signal to the power amplifier, and
wherein the first processing circuitry includes:
a gain compensation processing circuitry configured to equivalently generate the negative impedance in the output impedance of the power amplifier, thereby compensating a transmission gain so that the internal impedance inherent to the vibrator is equivalently reduced or disabled;
a phase compensation processing circuitry configured to compensate a phase of the driving signal so as to prevent oscillation of the vibrator; and
a compressor processing circuitry configured to adjust the transmission gain so as to reduce distortion of an output of the vibrator, wherein the compressor processing circuitry adjusts the transmission gain so that the output digital signal output from the first processing circuitry does not exceed a reference value, and
a downsampling circuitry configured to downsample the output digital signal output from the A/D converter;
wherein the second processing circuitry includes an oversampling circuitry configured to oversample a signal that is produced by the adding process; and
wherein a minimum-phase FIR filter is used in the downsampling circuitry and the oversampling circuitry.

2. The apparatus according to claim 1, wherein the vibrator is disposed in a cabinet having a resonance opening, to directly emit sound, and drives a Helmholtz resonator that is configured by the resonance opening and the cabinet, to emit a resonance sound from the resonance opening.

3. The apparatus according to claim 1, wherein the first processing circuitry further includes an equivalent model in which an electrical equivalent circuit of the vibrator including the cabinet is generated by a digital signal process, and wherein the compressor processing circuitry is configured to adjust the transmission gain based on a difference between an output digital signal output from the equivalent model, and the output digital signal output from the A/D converter or a signal corresponding to the output digital signal output from the A/D converter.

* * * * *